United States Patent [19]

Matsuda et al.

[11] Patent Number: 4,852,032
[45] Date of Patent: Jul. 25, 1989

[54] COMPACT ELECTRONIC COMPUTER

[75] Inventors: Tuyoshi Matsuda, Nara; Toru Tamiya, Nabari; Akihito Fujisawa, Yamatokoriyama, all of Japan

[73] Assignee: Sharp Kabushiki Kaisha, Osaka, Japan

[21] Appl. No.: 852,209

[22] Filed: Apr. 15, 1986

[30] Foreign Application Priority Data

Apr. 16, 1985 [JP] Japan .................. 60-82974
Apr. 16, 1985 [JP] Japan ................. 60-136381
Apr. 16, 1985 [JP] Japan ................. 60-136382
Apr. 16, 1985 [JP] Japan ................. 60-136383

[51] Int. Cl.$^4$ .......................................... G06F 1/00
[52] U.S. Cl. ................................................ 364/708
[58] Field of Search .......................... 364/708, 710; 248/1 A-1 J; 340/781, 784, 700

[56] References Cited

U.S. PATENT DOCUMENTS

| | | | |
|---|---|---|---|
| 4,294,496 | 10/1981 | Murey | 312/208 |
| 4,496,943 | 1/1985 | Greenblatt | 364/708 |
| 4,524,940 | 6/1985 | Yurchenco et al. | 248/359 |
| 4,561,044 | 12/1985 | Ogura et al. | 340/781 |
| 4,589,659 | 5/1986 | Yokoi et al. | 364/708 |
| 4,617,640 | 10/1986 | Kishi et al. | 364/708 |
| 4,635,128 | 1/1987 | Toyoda | 340/784 |
| 4,654,649 | 3/1987 | Kojima et al. | 340/781 |
| 4,669,053 | 5/1987 | Krenz | 364/708 |
| 4,680,674 | 7/1987 | Moore | 364/708 |

FOREIGN PATENT DOCUMENTS 0165132 5/1985 European Pat. Off. .

Primary Examiner—Gary V. Harkcom
Assistant Examiner—Dale M. Shaw
Attorney, Agent, or Firm—Birch, Stewart, Kolasch & Birch

[57] ABSTRACT

A compact electronic computer incorporates a main computer unit provided with a data display panel on its front surface; a handle on its top panal; a keyboard unit which is discretely associated with the main unit; and a positioner for vertically erecting and securing the keyboard is provided in front of the display panel, so that both the main unit and the keyboard can be integrated and easily carried to a desired location.

5 Claims, 5 Drawing Sheets

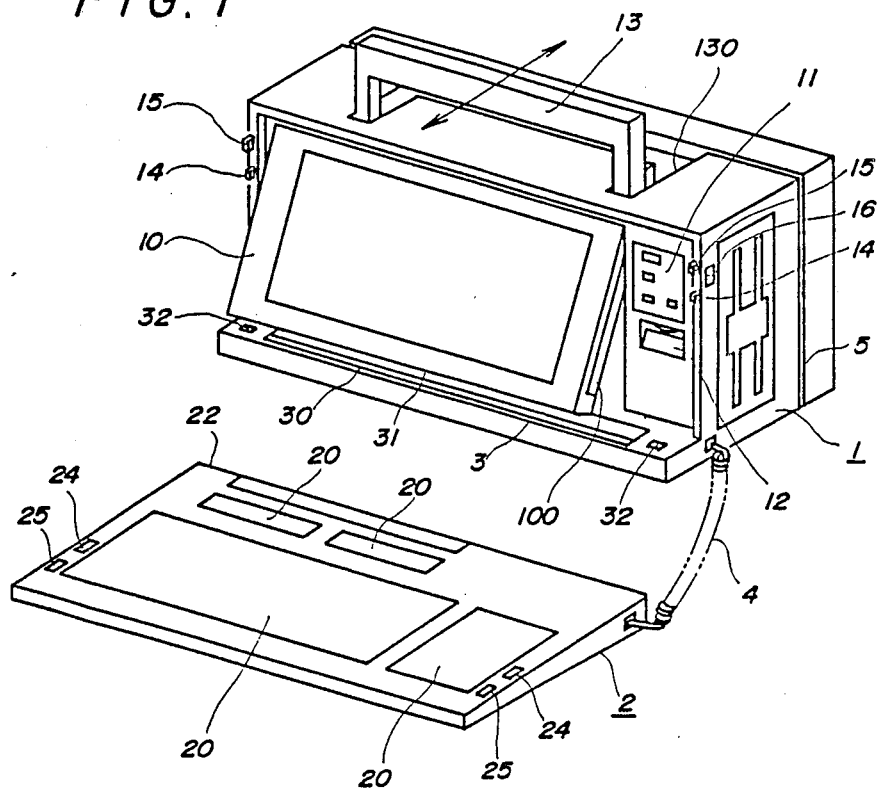
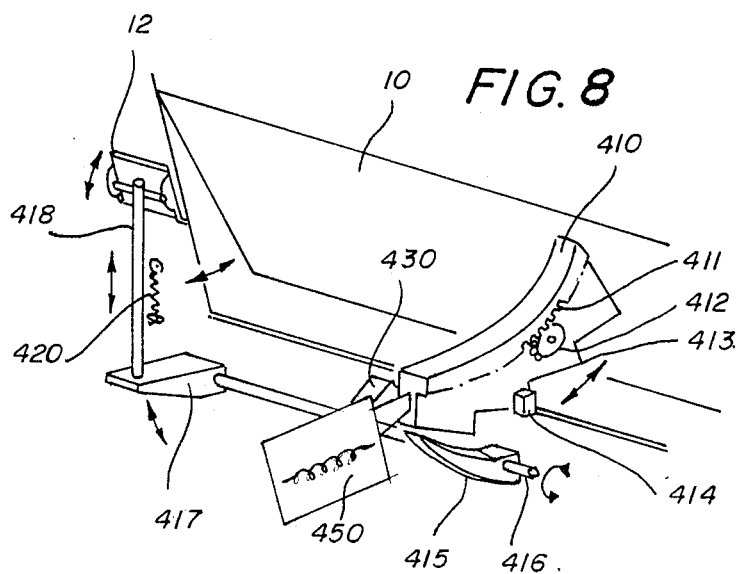
FIG. 1
FIG. 8

COMPACT ELECTRONIC COMPUTER

BACKGROUND OF THE INVENTION

The present invention relates to a compact electronic computer that can be connected to a keyboard and printer which are independent of the main computer. Therefore, the computer can be carried anywhere.

Conventionally, computer manufacturers produce compact electronic computers by integrally forming together the various devices normally detached from main electronic computers, thus making them portable. Despite their compact nature, do to the unit's variety of devices that are collectively integrated, operational convenience is not always satisfactory. Conversely, those computer units featuring satisfactory operational convenience are provided with devices independent of the main unit. These units, however, cannot easily be carried to desired places.

In addition, there are some conventional CRT display devices which in the angle of the display screen is adjustable. However, the angle adjustment mechanisms comprise a rotatable display part connected to the main unit using the friction between them causing angle adjustment to be performed by manually pushing or pulling the display part. As a result, the angle cannot be precisely adjusted by conventional means.

Furthermore, some conventional compact electronic computers provided with a liquid crystal display employ single light sources such as lamps for backlighting. Such a light-source cannot uniformly illuminate the surface of the liquid crystal display, resulting in poor visibility.

SUMMARY OF THE INVENTION

In light of the disadvantages inherent in conventional devices as described above, the present invention provides a compact electronic computer featuring improved operational convenience and portability in addition to realizing a smaller configuration by integrating the keyboard unit with the main unit and by providing means for vertically setting and securing said keyboard unit to the front surface of the electronic computer where the display panel is located.

Another object of the present invention is to provide a compact electronic computer with a precisely adjustable display angle.

A still further object of the present invention is to provide an electroluminescent (EL) display panel that uniformly illuminates the entire area of the liquid crystal display, yet is replaceable at the end of its service lift without the need to turn off the computer.

Briefly, according to the present invention, a compact electronic computer comprise a main unit and keyboard unit that are integrally constructed to provide portability, means for vertically setting and securing the keyboard unit on the front surface of the display panel of the electronic computer, and another means for precisely adjusting the angle of the display composed of a liquid crystal display. Furthermore, the present invention provides a compact electronic computer incorporating a liquid crystal display for displaying designated data, in which an electroluminescent (EL) display panel is used for backlighting for liquid crystal display, thus allowing the power to the EL display panel to be shut off during replacement.

BRIEF DESCRIPTION OF THE DRAWINGS

The present invention will be better understood from the detailed description given hereinbelow and the accompanying drawings which are given by way of illustration only, thus, do not limit the present invention, wherein:

FIG. 1 shows an external view of a compact electronic computer reflecting one of the preferred embodiments of the present invention;

FIG. 8 is the mechanism of FIG. 4 including a spring mechanism for pushing out the bottom of the display panel.

DESCRIPTION OF THE PREFERRED EMBODIMENTS

Figure 2:
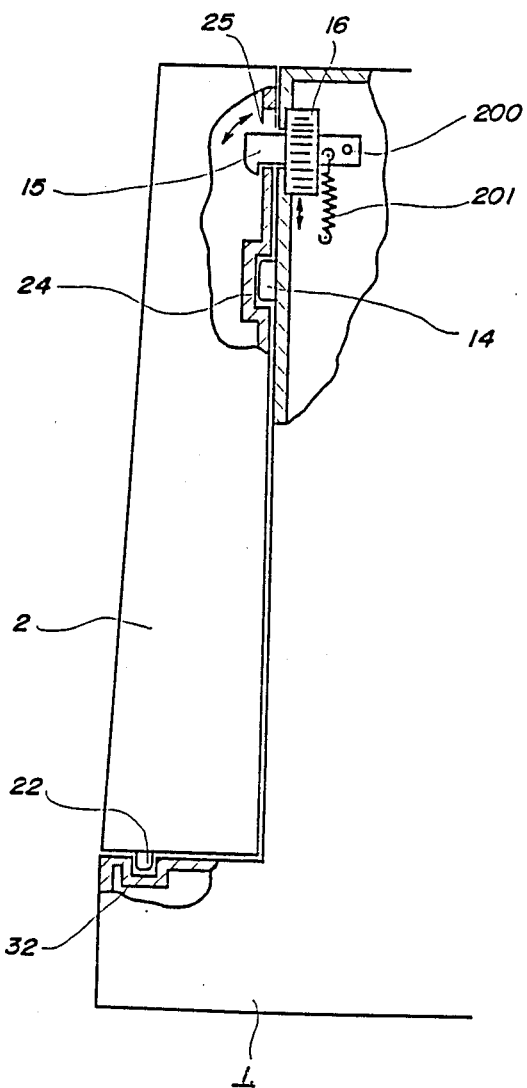
FIG. 2 shows a view of the installation of the keyboard unit on the main unit.
Figure 3:
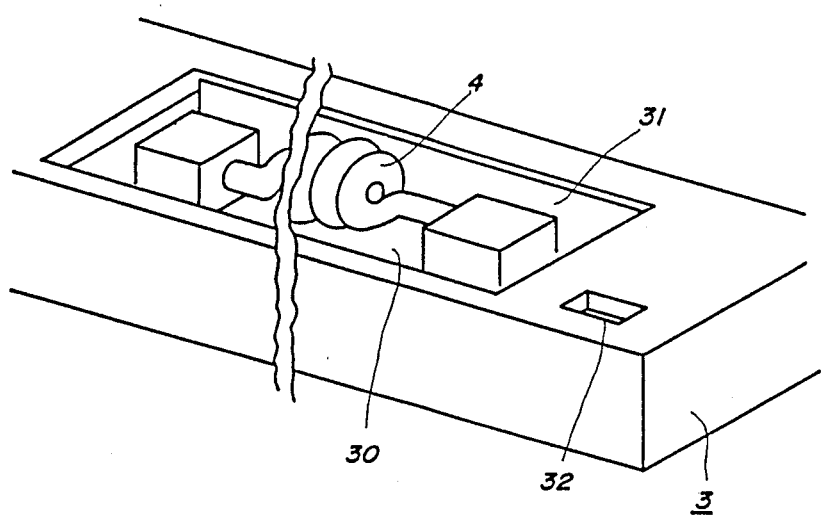
FIG. 3 shows the signal-cable storage box.

FIG. 1 is an external view of a compact electronic computer reflecting one of the preferred embodiments of the present invention. The main computer unit 1 has a projecting part 3 which extends from the bottom of the front panel. A liquid crystal display panel 10 containing a 640×200 dot segment display is provided on the front panel. The liquid crystal display panel 10 can also move freely forward pivoting from the top. The liquid crystal display panel displays alphanumeric characters and graphic patterns. An electroluminescent (EL) display panel can be inserted on the back surface of the liquid crystal display panel 10 through a replacement aperture 100 so that a worn out EL display panel can be replaced when required. An operation panel 11, equipped with various main computer display lamps, is situated next to the liquid crystal display panel 10. Below the operation panel 11, an operation button 12 to adjust the liquid crystal display panel 10 to an optimum angle is provided. When the operation button 12 is pushed down by a certain amount, the display-panel rotating mechanism is activated so that the bottom side of the liquid crystal display panel 10 is pushed forward, pivoting at the top. A carrying handle 13 is provided on the top surface of the main computer unit 1. The handle 13 is secured to the main computer unit 1 so that it can freely slide in the direction of the arrows, inside a groove 130, or can be inserted into the groove 130 which is identical in shape to the handle 13. Accordingly, by sliding the position of the handle 13, the center of gravity can be changed when carrying the main unit 1. In addition, the printer can be mounted on the top surface after completely lowering the handle 13 into the groove. Reference numeral 5 denotes a printer unit. In FIG. 1, the printer unit 5 is secured to the back of the main computer unit 1 so that it an easily be carried to desired places as part of the integral unit. The reference numeral 2 denotes a keyboard unit that feeds a variety of data and control data to the main computer unit 1. The keyboard 2 is provided with a number of alphanumerical and functional keys 20 and is connected to the main computer unit 1 via a signal cable 4 which can be freely connected and disconnected from the keyboard 2 and the main computer unit 1. A box 30 is provided in the center of the projecting part 3 for storing the signal cable when removed from the main computer unit 1 and the keyboard unit 2. As shown in FIG. 3, this box 30 is provided with a lid plate 31, normally closed by means of a spring (not shown). When carrying the main unit, the signal cable 4 can be put inside the box 30 by pushing down the lid plate 31. Recesses 32/32 provided at positions close to both ends of the projecting part 3 engage with pegs 22/22 (see FIG. 2), which enables the keyboard unit 2 to be vertically secured to the front surface of the liquid crystal display panel 10. Likewise, to secure the keyboard unit 2, guide projections 14/14 and stopped levers 15/15 are respectively provided on both ends of the front surface of the main computer unit 1. In addition, recessed portions 24/24 engaging with the said guide projections 14/14, and grooves 25/25 receiving said stopper levers 15/15, are respectively provided on both ends of the front surface of keyboard unit 2. The stopper levers 15/15, are either held in position or freed by means of a slide-key 16 provided on the side-surface of the main computer unit 1. Referring now to FIG. 2, the mechanism for securing the keyboard unit 2 is described below.

FIG. 2 shows the keyboard unit 2 secured to the front surface of the main computer unit 1. The stopper lever 15 is held by a pin 200 so that the lever can freely rotate while being pulled down by spring 201. The stopper lever 15 is controlled by the slide-key 16 provided on the side-surface of the main computer unit 1. Thus, by sliding the slide-key 16 in the directions of the arrows, the stopper lever 15 can rotate in the desired direction, so that keyboard unit 2 can be secured to or disengaged from the main computer unit 1. When securing keyboard unit 2 to the main computer unit 1, the slide-key 16 is first brought upward, then the peg 22 of the keyboard unit 2 is fit into the recessed portion 32, which allows the key-provided surface of keyboard unit 2 to face the liquid crystal display panel 10 before it is eventually placed upright. Next, the guide projection 14 fits into the recessed portion 24 so that the stopper lever 15 can be inserted into a groove 25. When the slide-key 16 is released, the stopper lever 15 is engaged with the groove 25 by the pulling force of the spring 201. The stopper lever can be freed by reversing the procedure described above. Before the securing operations are performed, the signal cable 4 is disengaged from both the main unit 1 and the keyboard unit 2 and stored in the box 30 which is covered by the bottom surface of keyboard unit 2, which acts as the lid. This arrangement protects the liquid crystal display panel 10 from damage, and in addition, since the key-provided surface of keyboard unit 2 is facing inward, the keyboard unit 2 is also protected from shock and damage when carrying the combined unit. Furthermore, the preferred embodiments of the present invention also allow the printer unit to be secured to the main computer unit 1, providing yet greater portability.

Figure 6:
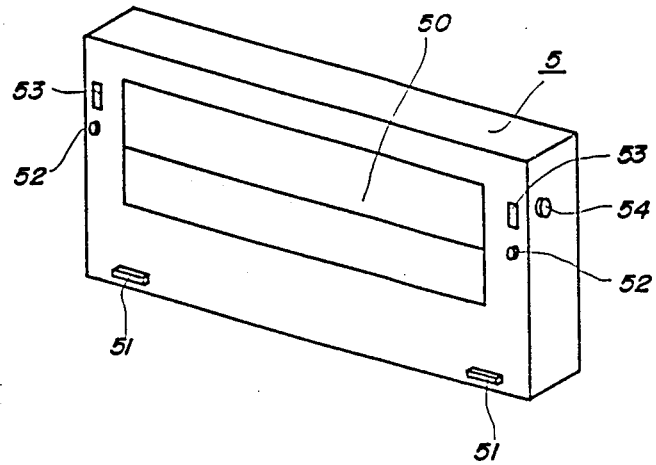
FIG. 6 shows an external view of the printer.
Figure 7:
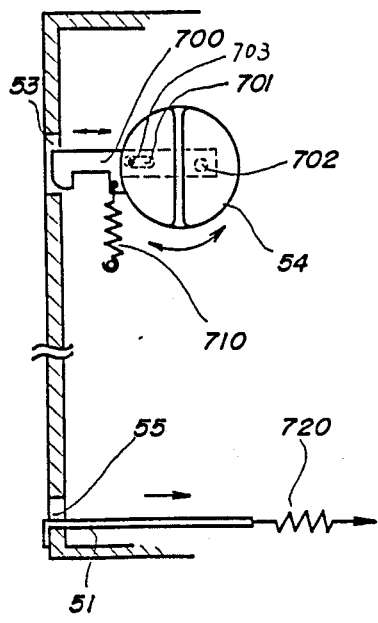
FIGS. 7 (A) and (B) show the mechanism and the operation for connecting the printer to the main unit.
Figure 7:
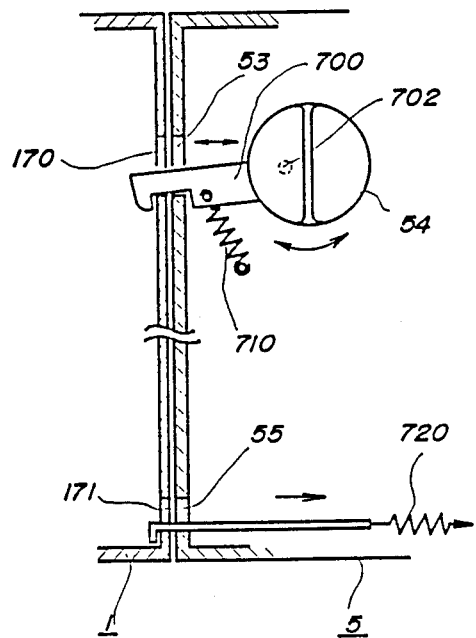

Referring now to FIGS. 6 and 7, the mechanism illustrated therein is described below. In this example. a printer unit 5 is a thermal type printer. A pair of guide pegs 52/52, apertures 53/53 allowing exposure of stopper levers 700/700 shown in FIG. 7, and apertures 55/55 allowing the projection of stationary plates 51/51 in lower positions, are respectively provided at both ends of the surface which mainly consists of the printing part 50. In addition, a pair of knobs 54/54 on the sides of the printer unit 5 are set close to apertures 53/53, causing the stopper levers 700/700 to be either engaged with or disengaged from the printer unit 5. Each of these stopper levers 700/700 is supported between a pin 703 set on the printer unit 5 and an oblong hole 701 formed on the stopper lever 700 which is capable of freely rotating and sliding against the pin 703. The spring 710 pulls said stopper lever 700 downward. The rear end of the stopper lever 700 is engaged with a pin 702 set on a knob 54. Consequently, when the knob 54 is rotated counterclockwise (see FIG. 7), the stopper lever 700 is drawn inside the printer 5. This represents the operating position of the printer.

When the knob 54 is rotated clockwise, the stopper lever 700 projects from the aperture 53 while rotating clockwise around the pivot pin 703. A spring 720 energizes the stationary plate 51 in the direction of the arrows so that the plate 51 can be drawn out of the aperture 55. Apertures 170/170 are provided on the back surface of the main computer unit 1 to be engaged with the apertures 53/53 when the printer unit 5 is upright. When engaging the printer unit 5 with the back surface of the main computer unit 1, the printing surface of the printer unit 5 is first made upright, and then the stationary plates 51/51 are drawn out of the apertures 55/55 before engaging with apertures 171/171. The plane surface of the printer unit 5 is then closely set to the back surface of the main computer unit 1, and the knob 54 is then rotated clockwise causing the stopper lever 700 to eventually pass through apertures 53 and 170. The knob 54 is then rotated counterclockwise so that the printer unit 5 can be secured to the main computer unit 1. The arrangement thus described significantly improves portability.

Figure 4:
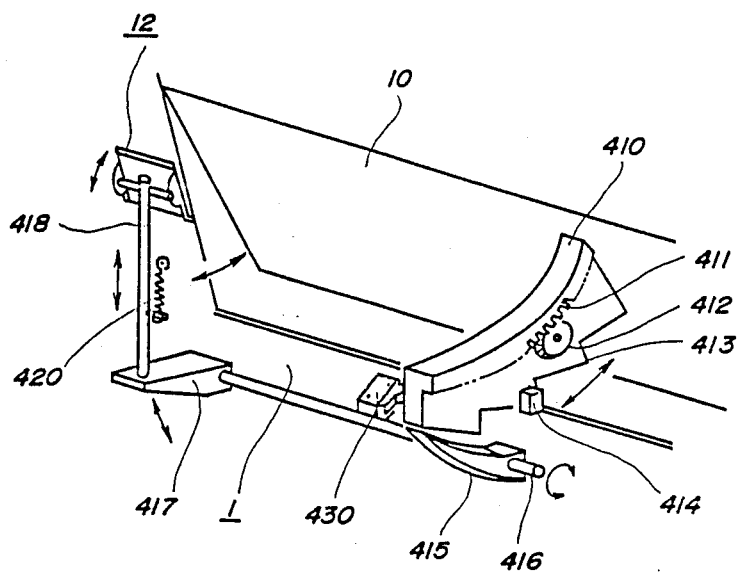
FIG. 4 shows a schematic view of the display panel rotation mechanism.

FIG. 4 shows s schematic view of the rotary movement mechanical assembly of the liquid crystal display panel 10 viewed from the inside, where the back surface of the display panel 10 is shown. The upper side of this display panel 10 is secured to the main computer unit 1 so that it can freely rotate to a maximum of about 90° against the front surface of the main unit 1. A compressed spring as shown in FIG. 8, reference 450, is provided between the main unit 1 and the liquid crystal display panel 10 so that the bottom side of the display panel 10 can be pushed outward. An angle adjustment arm 410 is provided on the back of the display panel 10 for determining the inclined angle of this display panel. This adjustment arm 410 is a sector shape, while the top is formed in an L-shape. A rack is provided below the L-shaped top portion, which is engaged with a damper gear 412 secured to the main unit 1. This gear 412 reduces the rotating speed of the display panel 10 which is energized by the compressed spring. A triangular tooth is provided at the bottom part of the arm 410 for stopping the rotary movement of the liquid crystal display panel at the predetermined angle of inclination (angles four inclination are represented in this embodiment). The triangular tooth is engaged with a stopper nail 415 which is secured to a shaft 416. A stopper 414 is provided in the center of the arm 410 to determine the furthest position of the liquid crystal display and stop the rotary movement of the liquid crystal display panel 10 when the stopper 414 comes into contact with the front panel of the main unit 1. When the liquid crystal display panel 10 is manually drawn out of the stop position, the stopper 414 can be rotated a maximum of about 90° beyond the position of the front panel. This rotation of the stopper causes the aperture 100 of FIG. 1 to be exposed, thus allowing the operator to replace EL panel. An actuation lever of a microswitch 430 set to the main unit 1 is closely held in contact with the other side of the arm 410 from the stopper 414. The microswitch is open when the actuation lever moves beyond the stop position set by the stopper 414. When the microswitch 430 is open, the power from the EL panel driver circuit is cut off, as a result, thus no power can be supplied to the EL panel. The worn out EL panel can then be replaced while still allowing power to be fed to the main computer unit 1.

The shaft 416 is held by the main unit 1 so that it can freely rotate and is connected to a rack 417 which is in turn is connected to a rod 418. The operation button 12 shown in FIG. 1 is attached to the rod 418. The rod 418 is energized upward by the spring 420. When the operation button 12 is depressed, the rod 418 overcomes the upward force of the spring 420, and moves downward, causing shaft 416 to rotate counterclockwise. The stopper nail 415 and one of the triangular teeth is disengaged by the rotation of the shaft 416, allowing the display panel 10 to rotate by the force of the compressed spring. When the operation button is released, the stopper nail 415 is engaged with the next triangular tooth so that the inclination angle can be changed one-step. If the operation button is continuously pressed, the display panel 10 keeps rotating until the stopper 414 comes into contact with the front panel. It is thus possible for the system to adjust the position of display panel 10 to the desired angle by a simple rotary mechanism mentioned above.

Figure 5:
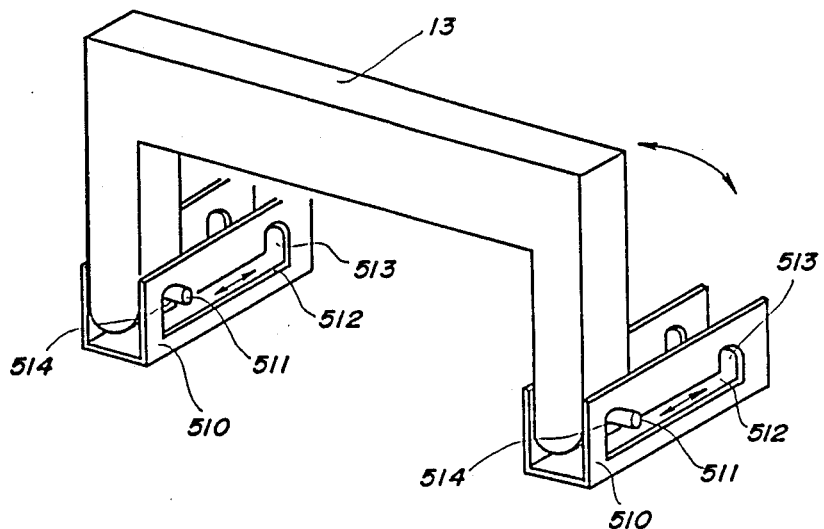
FIG. 5 shows a schematic view of the handle rotation mechanism.

Next, referring to one embodiment FIG. 5, the mechanism related to the installation of the handle 13 is described below.

A pair of U-shaped angles 510/510 are built inside of the groove 130 (see FIG. 1) on the top panel of the main computer unit 1, where each of these angles 510/510 is provided with apertures 512/512 as shown in FIG. 1. A pair of pins 511 secured to the tip end of the U-shaped handle penetrate holes 512/512. The handle 13 shown in FIG. 5 can be folded into the groove 130. The pins 511/511 travel inside the holes 512/512 between terminals 513 and 514 where these pins stop. The position of the terminal 513 exactly corresponds to the center of gravity of the entire system when keyboard unit 2 is secured to the main unit 1. The position of the terminal 514 exactly corresponds to the center of gravity of the entire system when the printer unit 5 is secured to the main unit 1.

In the arrangement above described, the operator can carry the complete computer unit, and yet, by folding down the handle, the top panel of the main unit 1 becomes flat, thus making it possible for the operator to place either the keyboard or printer on it.

As is clear from the above description, according to one embodiment of the present invention, an independent keyboard unit and/or printer unit can be secured to the main computer unit as required, the entire configuration becoming compact, and at the same time, more portable. Since the preferred embodiment provides means for securing these units on their back surfaces, the entire surfaces can be optionally colored, thus offering potential for fashionable design.

While only certain embodiments of the present invention have been described, it will be apparent to those skilled in the art that various changes and modifications may be made therein without departing from the spirit and scope of the present invention as claimed.

What is claimed is:

1. A compact electronic computer which includes a main unit and a display panel for data display, and display panel having an angle which is adjusted by securing an upper end of said display panel to said main unit, comprising:
    spring means for causing a bottom end of said display panel to rotate forward; and
    operation means, positioned close to said display panel, for adjusting the angle of the display panel to a desired angle;
    said operation means including,
    angle adjustment means, secured to a back surface of said display panel, for causing said bottom end of said display panel to move to an angle corresponding to said desired angle, and
    stopper means responsive to said operation means, for allowing or preventing the movement of said angle adjustment means, thereby enabling said display panel to be positioned at said desired angle without moving the main unit.

2. A compact computer incorporating a liquid crystal display device displaying data and an electroluminescent (EL) display for back-lighting said display device comprising;
    a display panel, one of whose sides is secured to the main computer unit so that it can freely rotate;
    an aperture provided on one side of said display panel unit for replacing said EL display unit;
    means for detecting rotary movement of said display panel; and
    means for suspending power supply to said EL display in response to a signal from said detection means.

3. The compact electronic computer according to claim 2, wherein said means for detecting rotary movement is a microswitch.

4. A compact computer incorporating a keyboard unit and a printer unit both of which are connected to the main computer unit, for easier carrying comprising;
    a handle which is substantially permanently attached to an upper surface of the main computer unit and which slides contiguously along said upper surface to adjust its position when at least one of said keyboard or printer unit is selectively coupled to said main unit, thereby varying the position of said handle to correspond to a center of gravity of the main computer unit.

5. The compact computer according to claim 4, wherein said main computer unit comprises:
    groove means, disposed in the surface of said main computer unit for providing a path for the contiguous sliding of said handle;
    handle holding means, for preventing the contiguous sliding of said handle when said handle is positioned at the center of gravity for the compact computer; and
    storage means for storing said handle in said upper surface of the main unit when the compact computer is not being carried.

* * * * *